(12) United States Patent
Minezawa et al.

(10) Patent No.: US 10,281,506 B2
(45) Date of Patent: May 7, 2019

(54) ELECTRIC DEVICE IDENTIFICATION SYSTEM, ELECTRIC DEVICE, AND ELECTRIC DEVICE IDENTIFICATION METHOD

(71) Applicants: Satoshi Minezawa, Tokyo (JP); Masaaki Yabe, Tokyo (JP); Hirotoshi Yano, Tokyo (JP)

(72) Inventors: Satoshi Minezawa, Tokyo (JP); Masaaki Yabe, Tokyo (JP); Hirotoshi Yano, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 205 days.

(21) Appl. No.: 14/761,979

(22) PCT Filed: Jan. 21, 2013

(86) PCT No.: PCT/JP2013/051090
§ 371 (c)(1),
(2) Date: Jul. 20, 2015

(87) PCT Pub. No.: WO2014/112125
PCT Pub. Date: Jul. 24, 2014

(65) Prior Publication Data
US 2015/0316592 A1    Nov. 5, 2015

(51) Int. Cl.
*G01R 21/00* (2006.01)
*G01R 19/00* (2006.01)
(Continued)

(52) U.S. Cl.
CPC ......... *G01R 21/00* (2013.01); *G01R 19/0092* (2013.01); *G01R 21/133* (2013.01);
(Continued)

(58) Field of Classification Search
CPC .. G01R 21/00; G01R 21/133; G01R 19/0092; G01R 19/2513; H02J 13/0013;
(Continued)

(56) References Cited

U.S. PATENT DOCUMENTS 5,351,178 A * 9/1994 Brennen ............... H02J 3/01
                                                          323/207
6,081,077 A * 6/2000 Canova ............. H05B 41/2828
                                                          315/224
(Continued)

FOREIGN PATENT DOCUMENTS

| JP | 2001-358618 A | 12/2001 |
| JP | 2005-160130 A | 6/2005 |
| JP | 2007-215258 A | 8/2007 |

OTHER PUBLICATIONS

International Search Report of the International Searching Authority dated Sep. 24, 2013 for the corresponding international application No. PCT/JP2013/051090 (and English translation).

*Primary Examiner* — Son T Le
*Assistant Examiner* — Akm Zakaria
(74) *Attorney, Agent, or Firm* — Posz Law Group, PLC

(57) ABSTRACT

A device load consumes power supplied from an AC power supply. A bypass circuit is provided in parallel with the device load. A controller controls current flowing through the bypass circuit so that an identification signal indicating information for identifying an electric device is superimposed on current flowing from the AC power supply to the electric device. A power measurement sensor detects the current flowing from the AC power supply to the electric device. A control device identifies the electric device based on the identification signal superimposed on the current detected by the power measurement sensor.

8 Claims, 10 Drawing Sheets

(51) Int. Cl.
 *H02J 13/00* (2006.01)
 *G01R 21/133* (2006.01)
 *G01R 19/25* (2006.01)

(52) U.S. Cl.
 CPC ...... *H02J 13/0013* (2013.01); *G01R 19/2513* (2013.01); *Y02B 70/3266* (2013.01); *Y02B 90/2607* (2013.01); *Y04S 20/242* (2013.01); *Y04S 40/12* (2013.01)

(58) Field of Classification Search
 CPC . Y02B 90/2607; Y02B 70/3266; Y04S 40/12; Y04S 20/242
 See application file for complete search history.

(56) References Cited

U.S. PATENT DOCUMENTS

| | | | |
|---|---|---|---|
| 6,499,656 B1 * | 12/2002 | Marsh | G06K 7/10039 235/375 |
| 2006/0029389 A1 * | 2/2006 | Cleary | H04B 10/806 398/33 |
| 2010/0070219 A1 * | 3/2010 | Azancot | H02J 5/005 702/62 |
| 2012/0112713 A1 * | 5/2012 | Kuehn | H02J 3/24 323/207 |
| 2013/0208733 A1 * | 8/2013 | Sugiyama | H04L 47/60 370/458 |
| 2014/0098700 A1 * | 4/2014 | Maruhashi | H04L 12/403 370/252 |

* cited by examiner

ELECTRIC DEVICE IDENTIFICATION SYSTEM, ELECTRIC DEVICE, AND ELECTRIC DEVICE IDENTIFICATION METHOD

CROSS REFERENCE TO RELATED APPLICATION

This application is a U.S. national stage application of International Patent Application No. PCT/JP2013/051090 filed on Jan. 21, 2013, the contents of which are incorporated herein by reference.

TECHNICAL FIELD

The present disclosure relates to an electric device identification system with simple composition and capable of identifying electric devices, an electric device and an electric device identification method.

BACKGROUND

At present, various technologies for identifying a type and operating status of an electric device are known. For example, Patent Literature 1 discloses art for identifying the type and operating status of an electric device to which power is supplied by a feeder line, by monitoring electric current flowing through the feeder line.

A high-frequency signal generating device disclosed in Patent Literature 1 causes a characteristic high-frequency electric current to be generated in the feeder line in accordance with operation of the electric device for which the operating status is to be estimated. Specifically, this high-frequency signal generating device causes a high-frequency electric current to be generated in the feeder line in accordance with operating status, by blocking for a fixed time and at fixed time intervals the electric current supplied to a specific electric device from the feeder line, when the electric device is operating.

PATENT LITERATURE

Patent Literature 1: Unexamined Japanese Patent Application Kokai Publication No. 2005-160130

However, the high-frequency signal generating device disclosed in Patent Literature 1 is fundamentally a composition provided external to the electric device. Accordingly, with the invention disclosed in Patent Literature 1, hardware for identifying the electric device must be prepared separate from the electric device, causing the composition of the system to become complex. Consequently, technology capable of identifying, with a simple composition, electric devices, such as preparing hardware provided in advance in the electric device, is sought.

SUMMARY

In consideration of the foregoing, it is an objective of the present disclosure to provide an electric device identification system capable of identifying electric devices by means of a simple composition, an electric device, and an electric device identification method.

In order to achieve the above objective, the electric device identification system according to the present disclosure is an electric device identification system comprising an electric device, an electric current sensor and an identification apparatus, wherein:

the electric device comprises:

a device load configured to consume electric power supplied from a power supply;

a load circuit disposed in parallel with the device load; and control means for controlling electric current flowing in the load circuit, so that an identification signal indicating information for identifying the electric device is superimposed on electric current flowing to the electric device from the power supply;

the electric current sensor is configured to detect the electric current flowing to the electric device from the power supply; and the identification apparatus is configured to identify the electric device based on the identification signal superimposed on the electric current detected by the electric current sensor.

With the present disclosure, it is possible to identify electric devices by means of a simple composition.

DETAILED DESCRIPTION

Below, the exemplary embodiments of the present disclosure are described with reference to the drawings.

(First Exemplary Embodiment)

Figure 1:
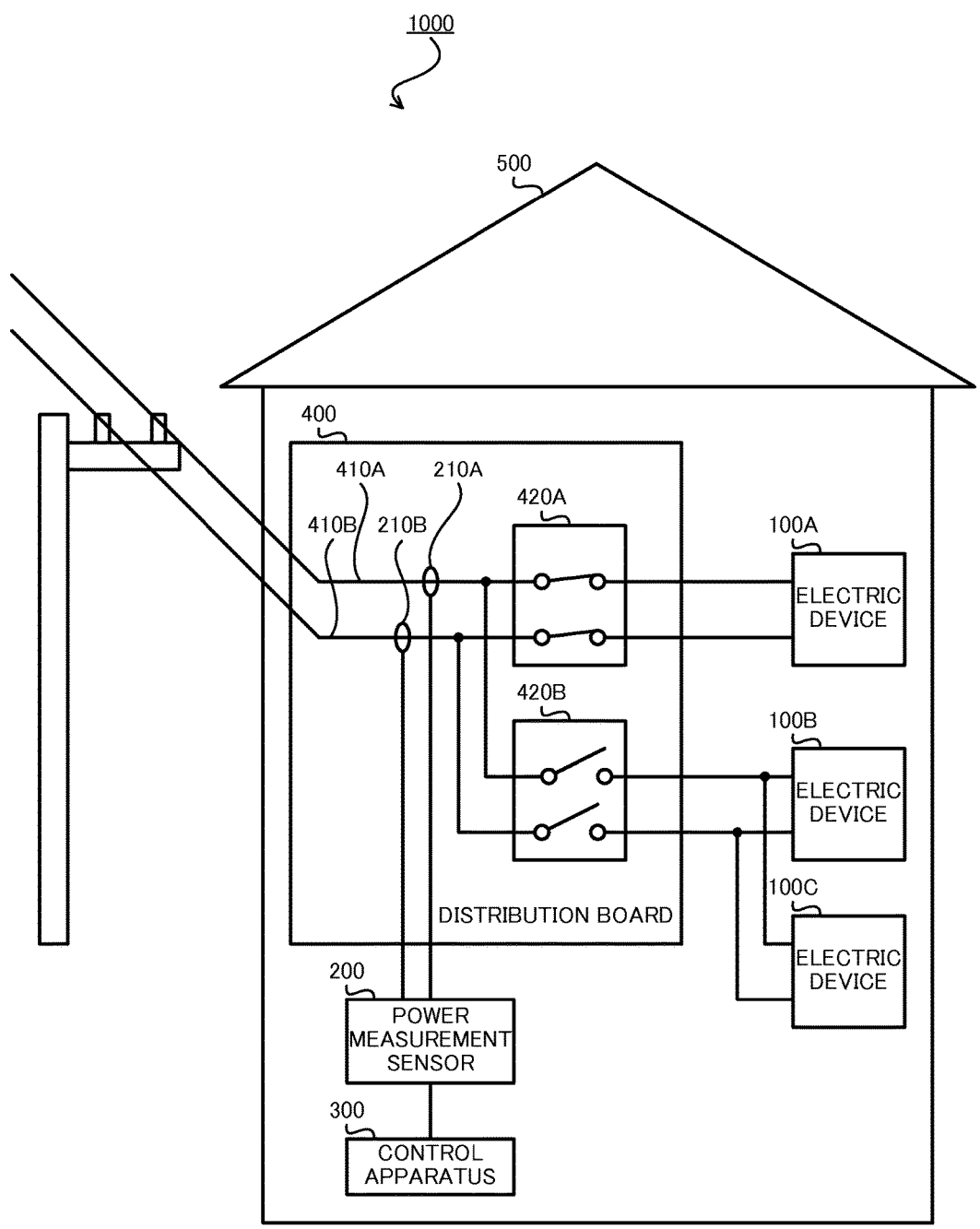
FIG. 1 is a drawing for explaining an overview of an electric device identification system according to a first exemplary embodiment of the present disclosure.

First, with reference to FIG. 1, an overview of an electric device identification system 1000 according to a first exemplary embodiment of the present disclosure is described. The electric device identification system 1000 is a system configured to identify an electric device 100 operating under electric power supplied from a distribution board 400 disposed in a house 500. Electric devices 100A, 100B and 100C in the drawing are collectively referred to as the electric device 100.

The electric device 100 operates under electric power supplied from the distribution board 400. The electric device 100 receives the supply of electric power from in-house wiring 410A and 410B connected to the distribution board 400. The in-house wiring 410A and 410B in the drawing are collectively referred to as the in-house wiring 410.

A power measurement sensor 200 measures the electric current and/or the like flowing in the in-house wiring 410, and measures the electric power consumed by the electric device 100 receiving the supply of electric power from the in-house wiring 410. As shown in FIG. 1, when a switch 420A is in a conducting state and a switch 420B is in a disconnected state, electric current supplied to the electric device 100A flows in the in-house wiring 410. On the other hand, when both the switch 420A and the switch 420B are in conducting states, an electric current that is the sum of the electric current supplied to the electric device 100A, the electric current supplied to the electric device 100B and the electric current supplied to the electric device 100C flows in the in-house wiring 410. The power measurement sensor 200 supplies data indicating the measured electric current (hereafter called the "electric current data") to a control apparatus 300.

The power measurement sensor 200 finds the electric current flowing inside the in-house wiring 410A based on a signal supplied from a current transformer 210A. In addition, the power measurement sensor 200 finds the electric current flowing inside the in-house wiring 410B based on a signal supplied from a current transformer 210B. The current transformers 210A and 210B in the drawing are collectively referred to as the current transformer 210. The current transformer 210A supplies a voltage signal evoked by electric current flowing in the in-house wiring 410A to the power measurement sensor 200. The current transformer 210B supplies a voltage signal evoked by electric current flowing in the in-house wiring 410B to the power measurement sensor 200. The current transformer 210 comprises a coil, for example.

The control apparatus 300 monitors the operating status of the electric device 100 based on electric current data supplied from the power measurement sensor 200, and controls operation of the electric device 100. In order to control the electric device 100, the control apparatus 300 identifies what kind of device and in what kind of operating status the electric device 100 is, based on the electric current data.

The distribution board 400 distributes electric power supplied from a transformer substation and/or the like to the electric devices 100. The distribution board 400 groups the electric devices 100 into multiple groups and can supply electric power to each group. FIG. 1 illustrates an example in which the electric device 100A belongs to a group A, and the electric device 100B and the electric device 100C belong to a group B.

The distribution board 400 comprises the switch 420A for managing the supply of electric power to the electric device 100A belonging to group A, and the switch 420B for managing the supply of electric power to the electric devices 100B and 100C belonging to group B. When the switch 420A is in a conducting state, electric power is supplied to the electric device 100A. When the switch 420B is in a conducting state, electric power is supplied to the electric devices 100B and 100C.

The house 500 is a house with power demand. FIG. 1 shows an example in which the electric devices 100A, 100B and 100C, the power measurement sensor 200, the control apparatus 300 and the distribution board 400 are disposed inside the house 500.

Figure 2:
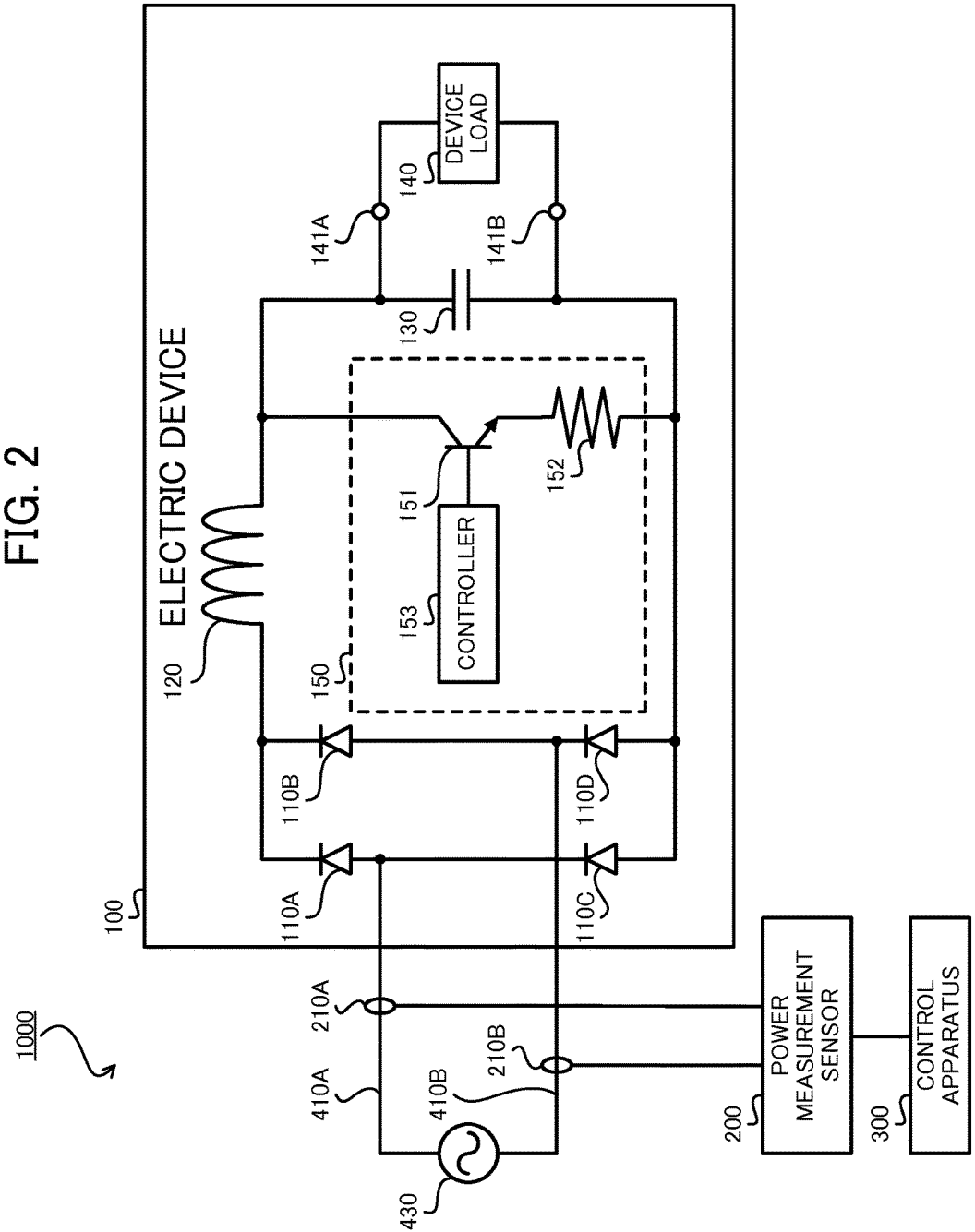
FIG. 2 is a block diagram showing the composition of an electric device identification system according to the first exemplary embodiment of the present disclosure.

Next, details regarding the composition of the electric device identification system 1000 are described, with reference to FIG. 2. In FIG. 2, an example is shown in which there is one electric device 100 to which electric power is supplied from the in-house wiring 410. In addition, in FIG. 2 the distribution board 400 (strictly speaking, a combination of a transformer substation, power lines and the distribution board 400) is expressed as the AC power supply 430.

As shown in FIG. 2, in the electric device identification system 1000, electric power is supplied to the electric device 100 from the AC power supply 430 via the in-house wiring 410. Here, the electric current flowing in the in-house wiring 410 is measured by the power measurement sensor 200. In addition, the electric device 100 is identified by the control apparatus 300 based on the results of measurement by the power measurement sensor 200.

Below, the composition of the electric device 100 is described in detail, with reference to FIG. 2.

The electric device 100 comprises diodes 110A, 110B, 110C and 110D; a coil 120; a capacitor 130; a device load 140; terminals 141A and 141B; a transistor 151; a resistor 152; and a controller 153.

The anode of the diode 110A is connected to the cathode of the diode 110C and to the in-house wiring 410A connected to one end of the AC power supply 430. The cathode of the diode 110A is connected to the cathode of the diode 110B and to one end of the coil 120.

The anode of the diode 110B is connected to the cathode of the diode 110D and to the in-house wiring 410B connected to the other end of the AC power supply 430. The cathode of the diode 110B is connected to the cathode of the diode 100A and to one end of the coil 120.

The anode of the diode 110C is connected to the anode of the diode 110D, to one end of the capacitor 130, to the terminal 141B and to one end of the resistor 152. The cathode of the diode 110C is connected to the anode of the diode 100A and to the in-house wiring 410A.

The anode of the diode 110D is connected to the anode of the diode 110C, to one end of the capacitor 130, to the terminal 141B and to one end of the resistor 152. The cathode of the diode 110D is connected to the anode of the diode 110B and to the in-house wiring 410B.

The diodes 110A, 110B, 110C and 110D convert the alternating-current power supplied between the in-house wiring 410A and the in-house wiring 410B into direct-current power, and comprise a rectifier circuit supplying one end of the coil 120 and one end of the resistor 152.

One end of the coil 120 is connected to the cathode of the diode 110A and the cathode of the diode 110B. The other end of the coil 120 is connected to the other end of the capacitor 130, the terminal 141A and the collector of the transistor 151.

One end of the capacitor 130 is connected to the anode of the diode 110C, the anode of the diode 110D, the terminal 141B, and one end of the resistor 152. The other end of the capacitor 130 is connected to the other end of the coil 120, the terminal 141A and the collector of the transistor 151.

The coil 120 and the capacitor 130 comprise a low-pass filter for generating stable voltages between the terminal 141A and the terminal 141B.

The device load 140 is a load that consumes electric power supplied from the power supply 430, and executes operations to be accomplished by the electric device 100. One end of the device load 140 is connected to the terminal 141A. The other end of the device load 140 is connected to the terminal 141B.

The terminal 141A is connected to the other end of the coil 120, the other end of the capacitor 130, one end of the device load 140 and the collector of the transistor 151.

The terminal 141B is connected to the anode of the diode 110C, the anode of the diode 110D, one end of the capacitor 130, the other end of the device load 140 and one end of the resistor 152.

The transistor 151 controls the volume of electric current flowing from the collector to the emitter, in accordance with the voltage applied between the gate and the emitter. The transistor 151 is for example an NPN (Negative Positive Negative) transistor.

The collector of the transistor 151 is connected to the other end of the coil 120, the other end of the capacitor 130 and the terminal 141A. The emitter of the transistor 151 is connected to the other end of the resistor 152. The base of the transistor 151 is connected to the controller 153.

The resistor 152 is a resistor with relatively low resistance value. One end of the resistor 152 is connected to the anode of the diode 110C, the anode of the diode 110D, one end of the capacitor 130 and the terminal 141B. The other end of the resistor 152 is connected to the emitter of the transistor 151.

The controller 153 controls the voltage between the base and emitter of the transistor 151, thereby controlling the electric current flowing between the collector and emitter of the transistor 151. For example, the controller 153 controls the electric potential of the base of the transistor 151.

Figure 3:
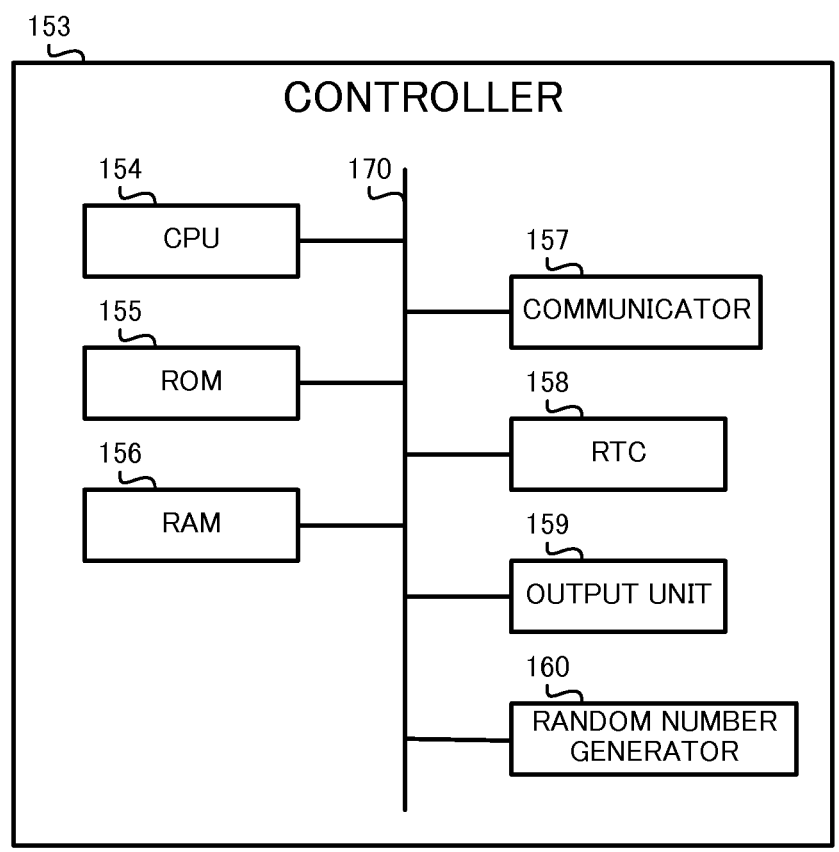
FIG. 3 is a block diagram showing the composition of a controller.

Here, the composition of the controller 153 is described with reference to FIG. 3.

The controller 153 comprises a CPU (Central Processing Unit) 154, a ROM (Read Only Memory) 155, a RAM (Random Access Memory) 156, a communicator 157, an RTC (Real Time Clock) 158, an output unit 159 and a random number generator 160. These constituent elements of the controller 153 are mutually connected to each other by a bus 170.

The CPU 154 controls the operation of the controller 153 as a whole in accordance with programs stored in the ROM 155.

The ROM 155 stores data and programs stipulating the operations of the controller 153. The CPU 154 can determine various types of information included in identification signals based on programs and data stored in the ROM 155.

The RAM 156 functions as a work area for the CPU 154. Accordingly, various types of data are temporarily stored in the RAM 156.

The communicator 157 communicates with the various units of the electric device 100 by wireless communication or wired communication. The CPU 154 can send information to and receive information from the various units of the electric device 100 by controlling the communicator 157. The communicator 157 comprises a communication IC (Integrated Circuit), for example.

The RTC 158 is a device for keeping time. The CPU 154 can detect the current time by referencing the RTC 158. The RTC 158 comprises a liquid crystal oscillator and battery, for example.

The output unit 159 applies a prescribed voltage between the base and emitter of the transistor 151. The output unit 159 comprises a D/A (Digital Analog) converter, for example.

The random number generator 160 generates random numbers as hardware. The random number generator 160 supplies information indicating the random numbers generated (hereafter referred to as "random number information") to the controller 153. The random number generator 160 for example comprises a diode for generating noise, and an A/D (Analog Digital) converter for converting the generated noise from an analog signal to a digital signal.

The transistor 151, the resistor 152 and the controller 153 make up a bypass circuit 150 connected in parallel with the device load 140. The bypass circuit 150 can adjust its own load (impedance, and/or the like). The bypass circuit 150 plays the role of superimposing a signal for transmitting information used to identify the electric device 100 (hereafter referred to as the "identification signal") on the electric current flowing to the device load 140, and of sending the signal to the in-house wiring 410. The identification signal is, for example, a high-frequency electric current signal that can be separated from the commercial power supply frequency (50 Hz, 60 Hz) by the bypass filter and the low-pass filter.

The power measurement sensor 200 measures the electric current and/or the like flowing in the in-house wiring 410 based on the voltage signal supplied from the current transformer 210. The power measurement sensor 200 supplies the electric current data acquired by measurement in succession to the control apparatus 300.

The control apparatus 300 detects the identification signal generated by the bypass circuit 150, based on the electric current data supplied from the power measurement sensor 200. The control apparatus 300 identifies the type and operating status of the electric device 100, based on the detected identification signal. The control apparatus 300 can exhibit the identification results to a user, or can control the electric device 100 based on the identification results.

Figure 4:
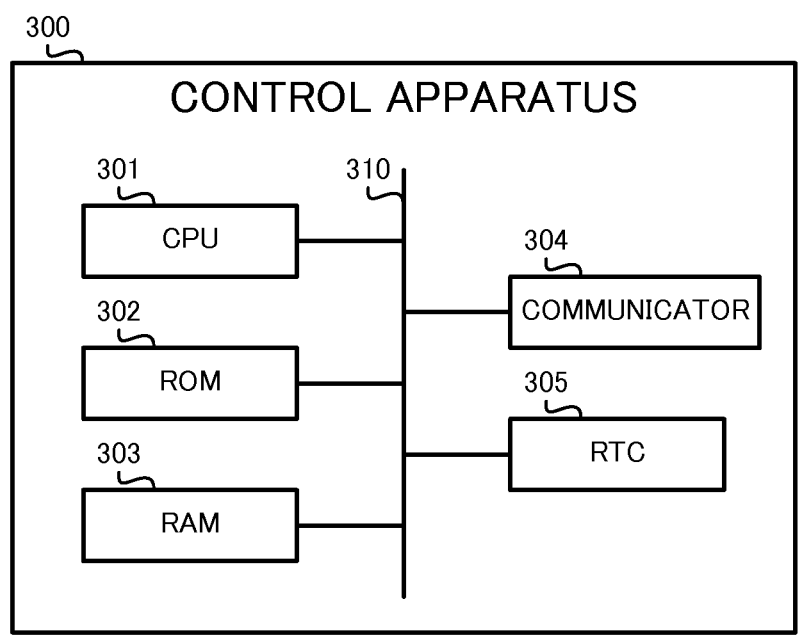
FIG. 4 is a block diagram showing the composition of a control apparatus.

The composition of the control apparatus 300 will now be described with reference to FIG. 4.

The control apparatus 300 comprises a CPU 301, a ROM 302, a RAM 303, a communicator 304 and an RTC 305. These constituent elements of the control apparatus 300 are mutually connected to each other by a bus 310.

The CPU 301 controls the operation of the control apparatus 300 as a whole in accordance with programs stored in the ROM 302.

The ROM 302 stores data and programs stipulating the operations of the control apparatus 300. The CPU 301 can determine what kind of information the various types of information contained in the identification signal are, based on the programs and data stored in the ROM 302.

The RAM 303 functions as a work area for the CPU 301. Accordingly, various types of data are temporarily stored in the RAM 303.

The communicator 304 communicates with the electric device 100 and other devices by means of wireless communication or wired communication. The CPU 301 can send information to and receive information from the electric device 100 and other devices by controlling the communicator 304. The communicator 304 comprises a communication IC, for example.

The RTC 305 is a device for keeping time. The CPU 301 can detect the current time by referencing the RTC 305. The RTC 305 comprises a liquid crystal oscillator and battery, for example.

Next, the identification signal generated by the bypass circuit 150 will be described, with reference to FIG. 5 and FIG. 6.

The identification signal is a signal superimposed on electric current supplied to the device load 140. In other words, the identification signal is an electric current signal. In this exemplary embodiment, the identification signal is an electric current signal generated by a modulation method through PAM (Pulse Amplitude Modulation), as shown in FIG. 5.

Figure 5:
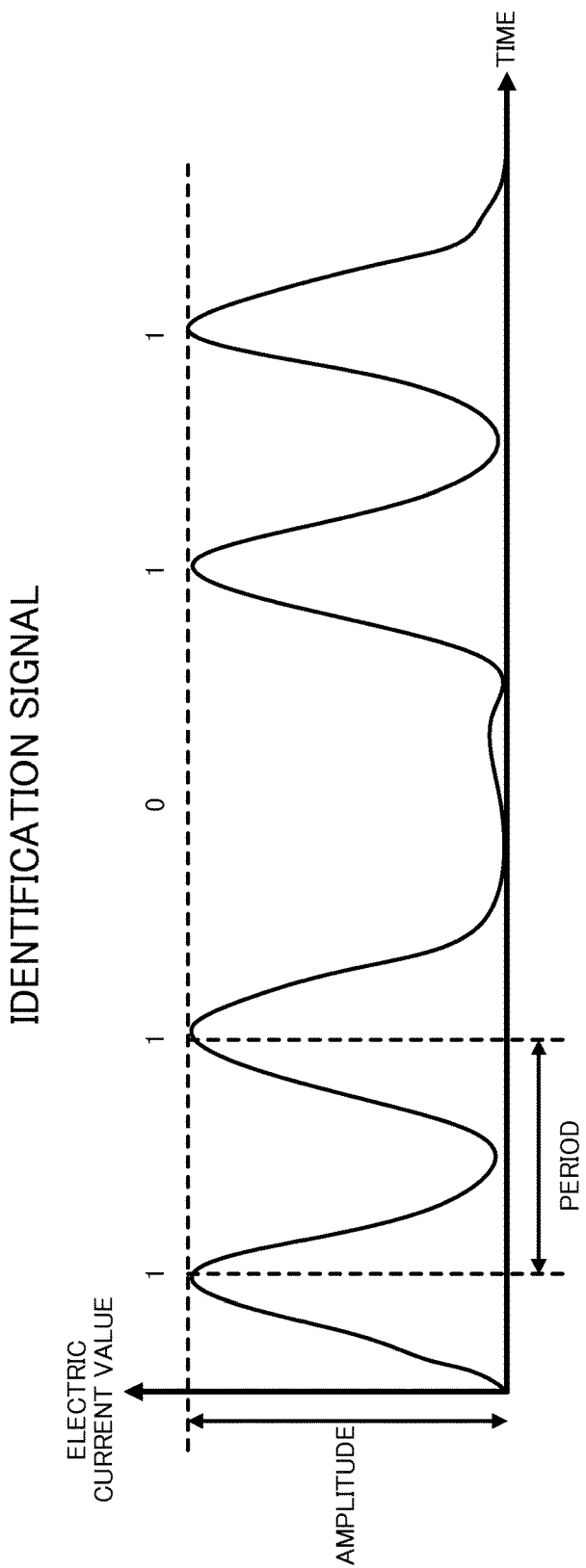
FIG. 5 is a drawing for explaining an identification signal.

FIG. 5 shows an example in which the identification signal indicates the 5-bit digital value of "11011" by means of electric current values that fluctuate with a prescribed amplitude at prescribed intervals. The amplitude and period of the identification signal can be appropriately adjusted.

The amplitude of the identification signal can be an amplitude such that the identification signal superimposed on the electric current can be detected from this electric current flowing in the in-house wiring 410, for example. The amplitude of the identification signal can be an amplitude sufficiently larger than the noise amplitude contained in the electric current flowing in the in-house wiring 410, for example.

The period of the identification signal can be set to a period such that the identification signal superimposed on the electric current is extractable from the electric current flowing in the in-house wiring 410 by the bypass filter, for example. The period of the identification signal can be a period sufficiently shorter than the period corresponding to the frequency of the commercial power supply, for example.

Figure 6:
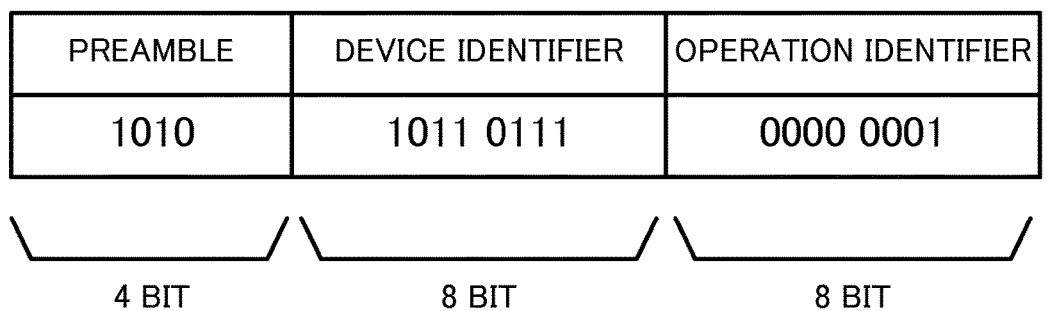
FIG. 6 is a drawing showing the format of the identification signal.

In addition, in this exemplary embodiment, the identification signal has a format comprising a preamble, a device identifier following the preamble, and an operation identifier following the device identifier, as shown in FIG. 6.

The preamble is digital data for indicating the lead section of the identification signal. In this exemplary embodiment, the preamble is four bits. The preamble is a fixed value. The preamble is preferably a value such that the preamble is easily detected. The preamble can be "1010", for example.

The device identifier is digital data for identifying what type of device the electric device 100 is. In this exemplary embodiment, the identifier is eight bits. The identifier can be made up of digital data assigned to the function, type, name, serial number, size, power consumption, and/or the like of the electric device 100, for example. The assignment of each bit of the device identifier can be appropriately adjusted. For example, it would be fine for the front four bits of the device identifier to indicate the function of the electric device 100, and for the back four bits of the device identifier to indicate the serial number of the electric device 100.

The operation identifier is digital data for identifying the operating status of the electric device 100. In this exemplary embodiment, the operation identifier is eight bits. The operation identifier can be made up of digital data assigned to the status (working, halted, producing errors, and/or the like) or the operation mode (high-output mode, normal mode, energy-saving mode, and/or the like) of the electric device 100. The assignment of each bit of the operation identifier can be appropriately adjusted. For example, it would be fine for the front four bits of the operation identifier to indicate the status of the electric device 100, and for the back four bits of the operation identifier to indicate the operation mode of the electric device 100.

The 20-bit digital data composed of the four-bit preamble, the eight-bit device identifier and the eight-bit operation identifier is appropriately referred to below as identification data.

Figure 7:
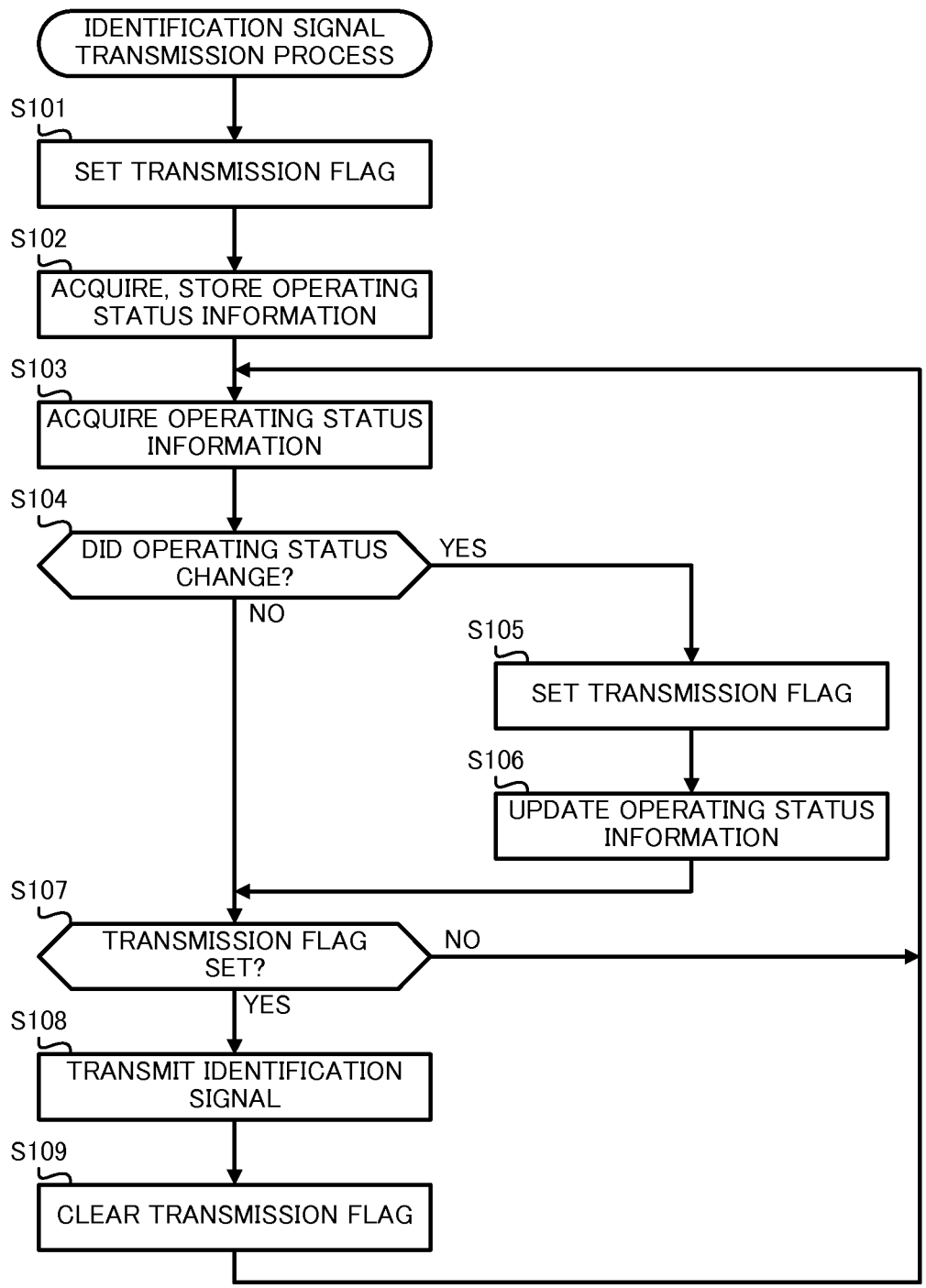
FIG. 7 is a flowchart showing an identification signal transmission process executed by the electric device according to the first exemplary embodiment of the present disclosure.

Next, an identification signal transmission process executed by the electric device 100 is described, with reference to the flowchart shown in FIG. 7. The CPU 154 with which the electric device 100 is provided starts the identification signal transmission process shown in FIG. 7 upon detecting that the power has been turned on.

First, the CPU 154 sets a transmission flag (step S101). This transmission flag is a flag set when an event that is a trigger for transmitting the identification flag occurs. The reason for setting the transmission flag in step S101 is that immediately after the power to the electric device 100 is turned on, it is desirable to transmit the identification signal. The transmission flag is stored in the RAM 156, for example.

When the process of step S101 is finished, the CPU 154 acquires and stores operating status information (step S102). The operating status information is information indicating the operating status of the electric device 100. The operating status information is information indicated by the operation identifier contained in the identification data, for example. The CPU 154 for example controls the communicator 157, and can acquire the operating status information from a module that controls operation of the electric device 100. The CPU 154 stores the acquired operating status information in the RAM 156. The operating status information stored in the RAM 156 in step S102 indicates the operating status immediately after the power to the electric device 100 was turned on.

When the process of step S102 is finished, the CPU 154 acquires the operating status information (step S103). The CPU 154 controls the communicator 157 and can acquire the operating status information from the module that controls operation of the electric device 100, the same as in step S102.

When the process in step S103 is finished, the CPU 154 determines whether or not the operating status has changed (step S104). Specifically, the CPU 154 determines whether or not the operating status indicated by the operating status information stored in the RAM 156 in step S102 and the operating status indicated by the operating status information acquired in step S103 are the same.

When the determination is that the operating status has changed (step S104: Yes), the CPU 154 sets the transmission flag (step S105). The reason the transmission flag is set in step S105 is that it is desirable for the identification flag to be transmitted when there is a change in the operating status of the electric device 100.

When the process in step S105 is finished, the CPU 154 updates the operating status information (step S106). Specifically, the CPU 154 overwrites the operating status information stored in the RAM 156 with the operating status information acquired in step S103.

On the other hand, when it is determined that the operating status has not changed (step S104: No), or when the process in step S106 is finished, the CPU 154 determines whether or not the transmission flag has been set (step S107).

When it is determined that the transmission flag is set (step S107: Yes), the CPU 154 transmits the identification signal (step S108). Specifically, the CPU 154 selects bits in sequence from the head of the 20-bit identification data, and impresses on the base of the transistor 151 an electric potential in accordance with the value of the selected bit. The period for switching the selected bit is the above-described prescribed period. Through the process in step S108, an identification signal such as that shown in FIG. 5 becomes contained in the electric current flowing in the in-house wiring 410.

When the process in step S108 is finished, the CPU 154 clears the transmission flag (step S109). When it is determined that the transmission flag has not been set (step S107: No), or when the process in step S109 is finished, the CPU 154 returns the process to step S103.

As explained above, with this exemplary embodiment an identification signal is transmitted to the in-house wiring 410 when the power to the electric device 100 is turned on, or when the operating status of the electric device 100 changes.

Figure 8:
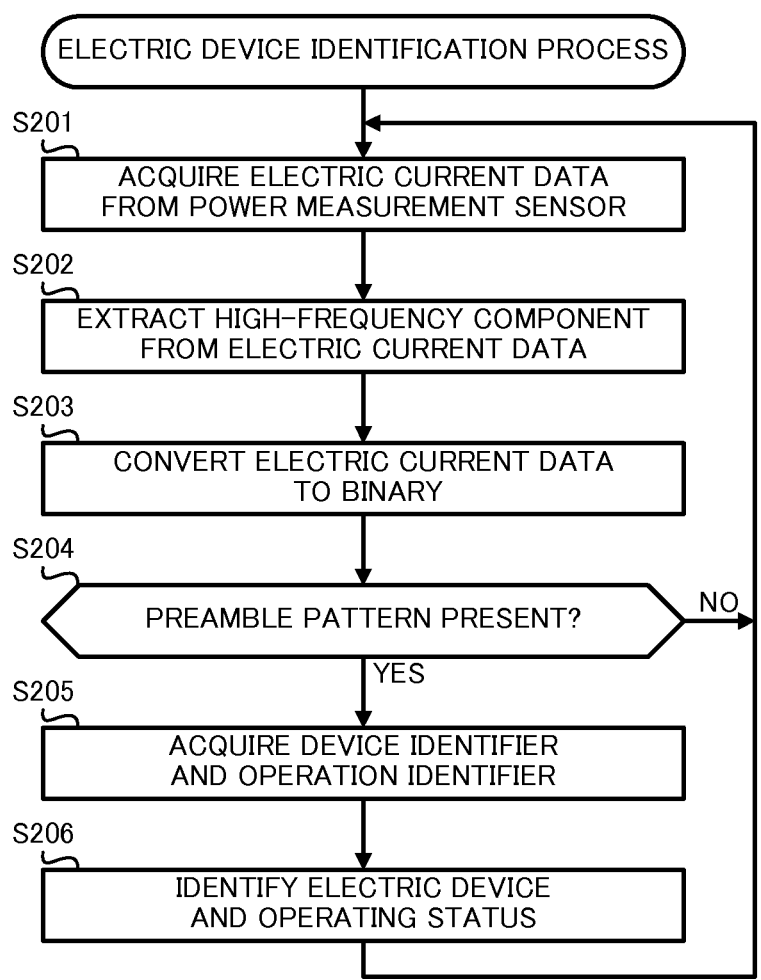
FIG. 8 is a flowchart showing an electric device identification process executed by the control apparatus according to the first exemplary embodiment of the present disclosure.

Next, an electric device identification process executed by the control apparatus 300 is described, with reference to the flowchart shown in FIG. 8. The CPU 301 with which the control apparatus 300 is provided starts the electric device identification process shown in FIG. 8 upon detecting that the power has been turned on.

First, the CPU 301 acquires electric current data from the power measurement sensor 200 (step S201). The power measurement sensor 200 constantly supplies electric current data to the control apparatus 300. The power measurement sensor 200 can create electric current data to supply to the control apparatus 300 based on voltage signals supplied from the current transformer 210. The CPU 301 can successively store the acquired electric current data in the RAM 303.

When the process in step S201 is finished, the CPU 301 extracts the high-frequency component from the electric current data (step S202). For example, the CPU 301 acquires electric current data with the low-frequency component by passing a prescribed interval of electric current data stored in the RAM 303 through the bypass filter software-wise. The removed low-frequency component is, for example, the component corresponding to the frequency of a commercial power supply.

When the process in step S202 is finished, the CPU 301 converts the electric current data to binary (step S203). Specifically, the CPU 301 converts the electric current data from which the low-frequency component has been removed to digital data of "0" and "1" in accordance with a prescribed threshold value.

When the process in step S203 is finished, the CPU 301 determines whether or not the preamble pattern is present (step S204). Specifically, the CPU 301 determines whether or not a pattern corresponding to the preamble pattern is contained in the pattern indicated by the electric current data that was converted to binary.

For example, suppose that when the identification signal has not been transmitted, the electric current data that has been converted to binary becomes "0", the preamble is "1010" and the prescribed period is T. In this case, the CPU 301 monitors the electric current data until the electric current data changes from "0" to "1", for example. Upon detection that the electric current data has changed from "0" to "1", when the CPU 301 detects that the electric current data at the time when T has elapsed from the detection time is "0", and the electric current data at the time when 2T has elapsed from the detection time is "1", it is possible to determine that the preamble has been detected.

When it is determined that the preamble pattern is present (step S204: Yes), the CPU 301 acquires the device identifier and the operation identifier (step S205). For example, the CPU 301 can acquire the device identifier and the operation identifier by extracting the 16 bits of values transmitted following the four bits of the preamble in the interval T from the electric current data that has been converted to binary.

When the process in step S205 is finished, the CPU 301 identifies the electric device 100 and the operating status (step S206). The CPU 301 can identify the electric device 100 based on the acquired device identifier. In addition, the CPU 301 can identify the operating status of the electric device 100 based on the acquired operation identifier.

When it is determined that the preamble pattern is not present (step S204: No), or when the process in step S206 is finished, the CPU 301 returns the process to step S201.

With this exemplary embodiment, it is possible to identify the electric device 100, and it is possible to identify the operating status of the electric device 100, based on the identification signal superimposed on the electric current flowing in the in-house wiring 410. In this manner, with this exemplary embodiment it is possible for the control device 300 physically separated from the electric device 100 to identify the type and operating status of the electric device 100.

In this exemplary embodiment, a circuit that should be added to the electric device 100 as a circuit for transmitting the identification signal may be the bypass circuit 150 of relatively simple composition. Accordingly, with this exemplary embodiment, space savings, cost reduction and simplification of composition can be anticipated compared to a case in which a circuit for transmitting the identification signal is added outside the electric device 100.

In addition, in this exemplary embodiment a preamble is contained in the identification signal. Consequently, reduction of error detection can be anticipated even when noise and/or the like is superimposed on the electric current flowing in the in-hoes wiring 410.

In addition, in this exemplary embodiment the identification signal is not transmitted frequently. Consequently, the effect on the operation that should be the main operation of the electric device 100 is small as a result of the bypass circuit 150 operating in order to transmit the identification signal.

(Second Exemplary Embodiment)

In the first exemplary embodiment, an example was illustrated in which the present disclosure is applied to an electric device 100 that is not an inverter device. Below, an example in which the present disclosure is applied to an electric device 101 that is an inverter device is described. For compositions that are the same as in the first exemplary embodiment, explanations are simplified or omitted.

Figure 9:
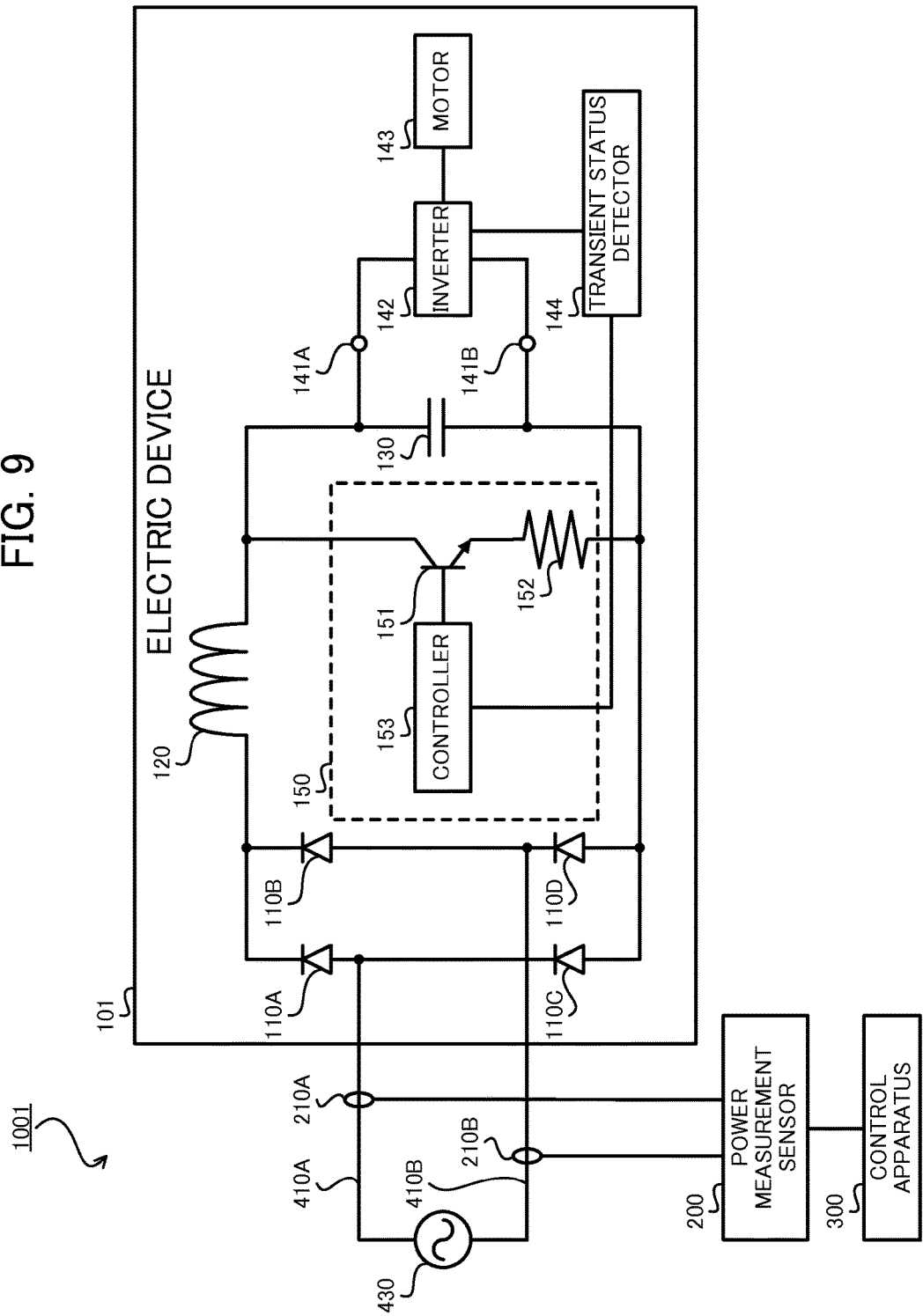
FIG. 9 is a block diagram showing the composition of an electric device identification system according to a second exemplary embodiment of the present disclosure.

As shown in FIG. 9, an electric device identification system 1001 according to the second exemplary embodiment of the present disclosure is a system for identifying the electric device 101 that is an inverter device operating under electric power supplied from the in-house wiring 410.

The electric device 101 is an inverter device. For example, the electric device 101 is an air conditioner, an IHCH (Induction Heater Cooking Heater), a tabletop IHCH, a refrigerator, an air purifier, a rice cooker, a dehumidifier, a ventilation fan and/or a vacuum.

The electric device 101 comprises an inverter 142 in place of the device load 140, and moreover other than comprising a motor 143 and a transient status detector 144, has the same composition as the electric device 100.

The inverter 142 converts the direct-current power supplied between the terminal 141A and the terminal 141B to alternating current power, and supplies the result to the motor 143. One input device of the inverter 142 is connected to the terminal 141A, and the other input device of the inverter 142 is connected to the terminal 141B. The inverter 142 is provided with an oscillation circuit comprising, for example, a capacitor, a coil, a rectifier, an oscillator and/or the like.

The motor 143 converts electric energy resulting from alternating current power supplied from the inverter 142 into mechanical energy. The motor 143 for example comprises a rotor that rotates about a rotation shaft, a stator used mutually with the rotor to generate a moment of rotation, a rotation shaft that conveys the rotor's rotation to the outside, and a support shaft supporting the rotation shaft.

The transient status detector 144 monitors the operating status of the inverter 142 and detects whether or not the inverter 142 is in a transient status. When the inverter 142 is in a transient status, the value of the electric current flowing in the in-house wiring 410 is presumed to be not stable, and when the inverter 142 is not in a transient status, the value of the electric current flowing in the in-house wiring 410 is presumed to be stable.

When the inverter 142 is in a status transitioning from a stopped status to an operating status, or when the inverter 142 is in a status transitioning from an operating status to a stopped status, the inverter 142 is presumed to be in a transient status. Even when the inverter 142 is in an operating status, when the alternating current power supplied to the motor 143 is not stable, it would be fine to think of the inverter 142 as being in a transient status. When for example fluctuations in the electric current flowing in the inverter 142 are not stable, it is possible to for the transient status detector 144 to determine that the inverter 142 is in a transient status. The transient status detector 144 supplies to the controller 153 a signal (hereafter referred to as the "transient status determination signal") indicating whether or not the inverter 142 is in a transient status. The transient status detector 144 comprises, for example, a circuit containing a comparator and a transformer.

The controller 153 determines whether or not the identification signal was transmitted, based on the transient status determination signal supplied from the transient status detector 144. For example, the controller 153 can halt or postpone transmission of the identification signal when it is determined that the inverter 142 is in a transient status, based on the transient status determination signal.

The electric device 101 that is an inverter device is provided in advance with a bypass circuit 150 as a power factor improvement circuit. Accordingly, by making software changes without altering the hardware composition of the electric device 101, it is possible to transmit identification signals from the electric device 101. In addition, when an identification signal has not been transmitted, the bypass circuit 150 functions as a power factor improvement circuit.

Next, an identification signal transmission process executed by the electric device 101 is described. Here, the identification signal transmission process executed by the electric device 101 is fundamentally the same as the identification signal process shown in FIG. 7. Accordingly, sections of the identification signal transmission process executed by the electric device 101 that differ from the identification signal transmission process shown in FIG. 7 are described below.

Figure 10:
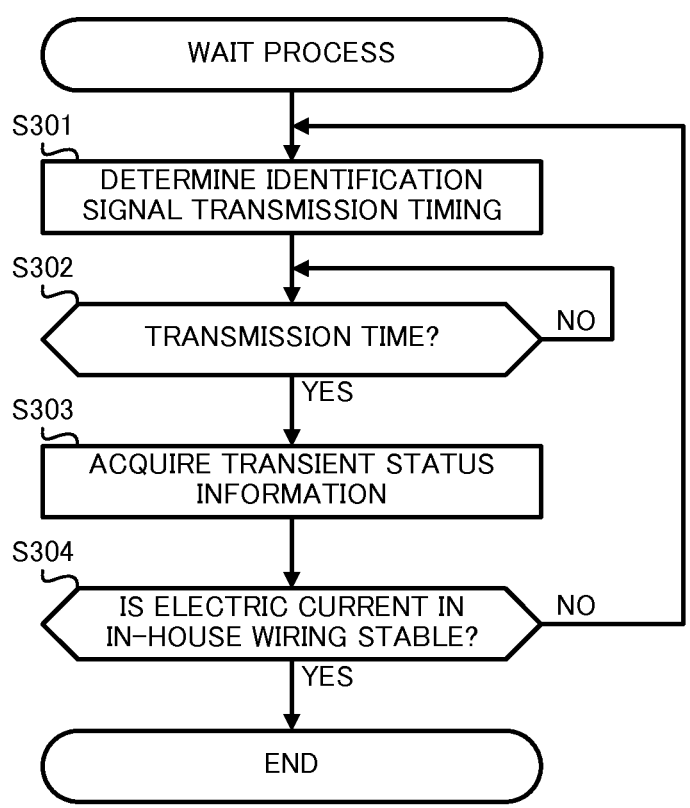
FIG. 10 is a flowchart showing a wait process executed by the electric device according to the second exemplary embodiment of the present disclosure.

The identification signal transmission process executed by the electric device 101 is such that when it is determined that the transmission flag is set (step S107: Yes), the wait process shown in the flowchart in FIG. 10 is executed, and after this wait process is finished, the process of transmitting the identification signal (step S108) is executed. Below, the wait process is described with reference to FIG. 10.

First, the CPU 154 determines the transmission timing of the identification signal (step S301). The method of determining the transmission timing of the identification signal can be appropriately adjusted. For example, it is possible for the CPU 154 to determine the transmission timing of the identification signal based on random number information supplied from the random number generator 160. For example, it is possible for the CPU 154 to determine as the transmission timing of the identification signal a time that has elapsed by an interval corresponding to a random number indicated by the random number information supplied from the random number generator 160, from the time indicated by the time information acquired from the RTC 158. The CPU 154 stores the time information indicating the determined transmission timing in the RAM 156.

When the process in step S301 is finished, the CPU 154 determines whether or not it is transmission time (step S302). Specifically, the CPU 154 determines whether or not the time indicated by the time information acquired from the RTC 158 is the transmission timing indicated by the time information stored in the RAM 156.

When it is determined that it is the transmission time (step S302: Yes), the CPU 154 acquires the transient status information (step S303). Specifically, the CPU 154 can control the communicator 157 and acquire the transient status information from the transient status detector 144.

On the other hand, when it is determined that it is not the transmission time (step S302: No), the CPU 154 returns the process to step S302. That is to say, the CPU 154 waits until it is the transmission time.

When the process in step S303 is finished, the CPU 154 determines whether or not the electric current in the in-house wiring 410 is stable (step S304). The CPU 154 determines whether or not the electric current in the in-house wiring 410 is stable for example based on the transient status information acquired in step S303.

When it is determined that the electric current in the in-house wiring 410 is stable (step S304: Yes), the CPU 154 ends the wait process and executes the process of transmitting the identification signal (step S108).

On the other hand, when it is determined that the electric current in the in-house wiring 410 is not stable (step S304: No), the CPU 154 returns the process to step S301.

With this exemplary embodiment, it is possible to identify the electric device 101 and to identify the operating status of the electric device 101, based on the identification information superimposed on the electric current flowing in the in-house wiring 410. With this exemplary embodiment, the electric device 101 is an inverter device and comprises a bypass circuit 150 as a power factor improvement circuit. Consequently, it is not necessary to add to the electric device 101 a circuit for transmitting the identification signal. Accordingly, with this exemplary embodiment, space savings, cost reduction and composition simplification can be anticipated compared to cases in which a circuit for transmitting the identification signal is added external to the electric device 101.

In addition, with this exemplary embodiment the electric device 101 randomly determines the identification signal transmission timing. Consequently, even if the power supply is turned on simultaneously for multiple electric devices 101, it can be anticipated that the probability of identification signals being transmitted with the same timing is low.

In addition, with this exemplary embodiment the electric device 101 defers transmission of the identification signal when it is determined that the electric current flowing in the in-house wiring 410 is not stable at the identification signal transmission timing. That is to say, the electric device 101 transmits the identification signal when it is determined that the electric current flowing in the in-house wiring 410 is stable. Accordingly, it can be anticipated that erroneous detection of identification signals will decrease.

Above, the exemplary embodiments of the present disclosure were described but in implementing the present disclosure, applications and variations in a variety of forms are possible, and the above-described exemplary embodiments are intended to be illustrative and not limiting.

In the first and second exemplary embodiments, an example was described in which the bypass circuit 150 comprises the resistor 152. In the present disclosure, the bypass circuit 150 need not comprise the resistor 152.

In the first and second exemplary embodiments, an example was described in which the identification signal was transmitted only one time, when the event that is the trigger for transmitting the identification signal occurs. In the present disclosure, it would be fine for the identification signal to be transmitted multiple times when the event that is the trigger thereof occurs. In this case, the identification signal may be transmitted with a fixed period, or the intervals at which the identification signal is transmitted may be determined randomly.

In addition, in cases in which the identification signal is transmitted with a fixed period, the period may differ for each electric device. In addition, regardless of the absence or presence of the occurrence of the event that is the trigger, it would be fine for the identification signal to be transmitted with a prescribed period or at randomly determined intervals.

In addition, the timing of the identification signal being transmitted may be determined so that the time range from when transmission of one identification signal starts until the end thereof is within one term out of multiple terms (slots) partitioned by equal intervals. In this case, the above-described slot being longer than the time needed for one identification signal to be transmitted is a prerequisite. However, the above-described slot is preferably as short a time as possible. With this composition, overlapping of a given identification signal and another identification signal by a small time does not occur, and as a result it is possible to reduce the probability of identification signals overlapping.

If the above-described time range is within one slot, the timing of when transmission of the identification signal starts is arbitrary. For example, the timing of when transmission of the identification signal starts may be the lead time of the above-described slot. Or, the timing of when transmission of the identification signal starts may be randomly determined. In this case, until the above-described time range is contained in one slot, the process of randomly determining the timing of when transmission of the identification signals starts is repeated.

Specifically, first the timing of when transmission of the identification signal starts is provisionally determined randomly. Next, when transmission of the identification signal is started at the provisionally determined timing, a determination is made as to whether or not transmission of the identification signal will be finished within one slot. Here, when it is determined that transmission of the identification signal will be finished within one slot, the provisionally determined timing is confirmed as the timing of when transmission of the identification signal starts. On the other hand, when it is determined that transmission of the identification signal will not be finished within one slot, the timing of when transmission of the identification signal will starts is again provisionally determined randomly.

The times of partitions in the above-described slot may be determined in advance, or may be synchronized among the electric devices. When synchronized, it is possible to achieve synchronization for example by having the communicator 157 comprising a given electric device transmit a prescribed signal to the communicator 157 comprising each of the other electric devices each time the start time of each slot arrives.

In addition, each electric device may notify the other electric devices of transmission of an identification signal prior to transmitting the identification signal. With such a composition, it is possible for each electric device to determine whether or not another electric device is transmitting an identification signal, prior to transmission of an identification signal. In this case, it is possible for each electric device to transmit an identification signal when there are no worries about identification signals overlapping.

In the first and second exemplary embodiments, an example was described in which the bypass circuit 150 comprises an NPN-type transistor 151. In the present disclosure, it is possible to utilize a variety of elements capable of controlling electric currents so as to cause bypassing from the other end of the coil 120 to the anode of the diode 110C and/or the like, in place of the NPN-type transistor 151.

In the first and second exemplary embodiments, an example was shown in which the identification data is converted to an electric current signal by a PAM method. In the present disclosure, it is possible to utilize a variety of methods as means for converting the identification data into electric current signals. For example, it is possible to utilize modulation methods such as a PWM (Pulse Width Modulation) method, a PPM (Pulse Position Modulation) method and/or the like.

In the first and second exemplary embodiments, an example was described in which the identification data comprises a preamble, a device identifier and an operation identifier. In the present disclosure, the composition of the identification data is not limited to this example. For example, it would be fine for the identification data to comprise a preamble and a device identifier. In addition, it would be fine for a preamble to not be included in the identification data. In addition, the bit count is naturally not limited to the above-described example.

In the first and second exemplary embodiments, an example was described in which the identification signal is an electric current signal indicated by an electric current value. In the present disclosure, it would be fine for the identification signal to be a signal indicated by any of frequency component, phase difference between electric current and voltage, electric power value, power factor, voltage value or a combination of these.

In the present disclosure, the constituent elements for executing the processes explained in the first and second exemplary embodiments are not limited to the above-described constituent elements. That is to say, it would be fine for all or a portion of the above-described processes to be executed by the electric device identification system as a whole. For example, in the first and second exemplary embodiments, an example was described in which the power measurement sensor 200 supplies electric current data to the control apparatus 300 and the identification signal is detected based on the electric current data supplied to the control apparatus 300. In the present disclosure, it would be fine for the power measurement sensor 200 to detect the identification signal.

In the first and second exemplary embodiments, an example was shown in which the controller 153 comprises the CPU 154, the ROM 155 and the RAM 156, and the various processes are realized by software in accordance with programs the CPU 154 stores in the ROM 155. In addition, in the first and second exemplary embodiments, an example was shown in which the control apparatus comprises the CPU 301, the ROM 302 and the RAM 303, and the various processes are realized by software in accordance with programs the CPU 301 stores in the ROM 302. However, the processes executed by the controller 153 and the control apparatus 300 are not limited to being realized by software. For example, it would be fine for the controller 153 or the control apparatus 300 to comprise an FPGA (Field Programmable Gate Array), a PLD (Programmable Logic Device), a DSP (Digital Signal Processor) and/or the like.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The present disclosure can be applied to an electric device operated by electric power supplied from a power supply.

The invention claimed is:

1. An electric device identification system comprising: an electric device comprising:
   a device load including an inverter circuit and configured to consume electric power supplied from a power supply;
   a load circuit disposed in parallel with the device load and configured to control electric power supplied to the inverter circuit to improve a power factor in the device load;
   a controller configured to control electric current flowing in the load circuit, so that an identification signal indicating information for identifying the electric device is superimposed on electric current flowing to the electric device from the power supply;
   an electric current sensor configured to detect the electric current flowing to the electric device from the power supply; and
   an identification apparatus configured to identify the electric device based on the identification signal superimposed on the electric current detected by the electric current sensor,
   wherein
   the load circuit includes a transistor and a resistor connected in series, the transistor and resistor being connected in parallel with the device load, and
   the controller is configured to control the electric current flowing in the load circuit by controlling operation of the transistor.

2. The electric device identification system according to claim 1, wherein:
   the identification signal has a preamble section of a predetermined pattern, and a data section following the preamble section; and
   the identification apparatus is configured to detect the preamble section from the electric current detected by the electric current sensor, and when the preamble section is detected, detect from the electric current the data section following the preamble section.

3. The electric device identification system according to claim 1, wherein:
   the electric device further comprises a status determiner configured to determine whether or not the operating status of the electric device is in a stable status; and,
   the controller is configured to execute control for superimposing the identification signal when it is determined by the status determiner that the operating status of the electric device is a stable status.

4. The electric device identification system according to claim 1, wherein the controller is configured to execute the control for superimposing the identification signal multiple times, for identification signals indicating the same information.

5. An electric device identification system comprising:
   multiple electric devices, each electric device comprising:
   a device load configured to consume electric power supplied from a power supply;
   a load circuit disposed in parallel with the device load;
   a determiner configured to determine a timing for the start of control for superimposing an identification signal so that control for superimposing the identification signal is contained in one period out of multiple periods partitioned by contiguous equal intervals, the multiple periods being common to the multiple electric devices and the identification signal indicating information for identifying a local electric device among the multiple electric devices; and
   a controller configured to control electric current flowing in the load circuit, so that the identification signal is superimposed on electric current flowing to the local electric device from the power supply, and the controller being further configured to start control for superimposing the identification signal with the timing determined by the determiner,
   an electric current sensor configured to detect a total electric current flowing to the multiple electric devices from the power supply, and
   an identification apparatus configured to identify the multiple electric devices based on the identification signal superimposed on the total electric current detected by the electric current sensor,
   wherein
   the load circuit includes a transistor and a resistor connected in series, the transistor and resistor being connected in parallel with the device load, and
   the controller is configured to control the electric current flowing in the load circuit by controlling operation of the transistor.

6. An electric device comprising:
   a device load including an inverter circuit and configured to consume electric power supplied from a power supply;
   a load circuit disposed in parallel with the device load and configured to control electric power supplied to the inverter circuit to improve a power factor in the device load; and
   a controller configured to control electric current flowing in the load circuit, so that an identification signal indicating information for identifying the electric device is superimposed on electric current flowing to the electric device from the power supply,
   wherein
   the load circuit includes a transistor and a resistor connected in series, the transistor and resistor being connected in parallel with the device load, and
   the controller is configured to control the electric current flowing in the load circuit by controlling operation of the transistor.

7. An electric device identification method comprising:
   controlling electric current flowing in a load circuit, so that an identification signal indicating information identifying an electric device is superimposed on electric current flowing to the electric device from a power supply, the electric device comprising a device load including the inverter circuit and configured to consume electric power supplied from the power supply, and a load circuit disposed in parallel with the device load and configured to control electric power supplied to the inverter circuit for improving a power factor in the device load;

detecting the electric current flowing to the electric device from the power supply; and identifying the electric device, based on the identification signal superimposed on the detected electric current, wherein the load circuit includes a transistor and a resistor connected in series, the transistor and resistor being connected in parallel with the device load, and the controller is configured to control the electric current flowing in the load circuit by controlling operation of the transistor.

8. The electric device identification system according to claim 1 further comprising a transient status detector configured to detect whether or not the inverter circuit is in a transient status, wherein the controller is configured to execute control for superimposing the identification signal when the inverter circuit is detected as not in a transient status by the transient status detector.

* * * * *